(12) United States Patent
Passerini et al.

(10) Patent No.: US 7,599,231 B2
(45) Date of Patent: Oct. 6, 2009

(54) ADAPTIVE REGULATOR FOR IDLE STATE IN A CHARGE PUMP CIRCUIT OF A MEMORY DEVICE

(75) Inventors: Marco Passerini, Lozza (IT); Stefano Sivero, Capriate (IT); Andrea Sacco, Alessandria (IT); Monica Marziani, Arcore (IT)

(73) Assignee: Atmel Corporation, San Jose, CA (US)

( * ) Notice: Subject to any disclaimer, the term of this patent is extended or adjusted under 35 U.S.C. 154(b) by 284 days.

(21) Appl. No.: 11/548,319

(22) Filed: Oct. 11, 2006

(65) Prior Publication Data

US 2008/0089140 A1    Apr. 17, 2008

(51) Int. Cl.
G11C 7/00 (2006.01)
(52) U.S. Cl. .............................. 365/189.11; 365/189.01; 365/226; 365/229; 327/390
(58) Field of Classification Search ............ 365/185.18, 365/185.25, 189.01, 189.09, 189.11, 226, 365/229; 327/390
See application file for complete search history.

(56) References Cited

U.S. PATENT DOCUMENTS

| | | | | |
|---|---|---|---|---|
| 4,451,748 | A * | 5/1984 | Amrany | 327/390 |
| 5,303,188 | A | 4/1994 | Kohno | |
| 5,410,680 | A | 4/1995 | Challa et al. | |
| 5,949,666 | A | 9/1999 | Daniele et al. | |
| 5,969,557 | A * | 10/1999 | Tanzawa et al. | 327/291 |
| 6,172,553 | B1 * | 1/2001 | Murray et al. | 327/530 |
| 6,259,632 | B1 | 7/2001 | Khouri et al. | |
| 6,278,633 | B1 | 8/2001 | Wong et al. | |
| 6,411,554 | B1 * | 6/2002 | Kawai | 365/189.09 |
| 6,420,215 | B1 | 7/2002 | Knall et al. | |
| 6,549,450 | B1 | 4/2003 | Hsu et al. | |
| 6,639,838 | B2 | 10/2003 | Fournel et al. | |
| 6,842,381 | B2 | 1/2005 | Chih et al. | |
| 6,906,576 | B2 | 6/2005 | Sivero et al. | |
| 6,944,059 | B2 | 9/2005 | Macerola | |
| 7,030,684 | B2 | 4/2006 | Kim | |
| 7,042,788 | B2 * | 5/2006 | Miki | 365/226 |
| 2004/0245975 | A1 | 12/2004 | Tran et al. | |
| 2006/0083062 | A1 | 4/2006 | Park | |
| 2006/0114721 | A1 | 6/2006 | Frulio et al. | |
| 2006/0133149 | A1 | 6/2006 | Chae et al. | |
| 2007/0076492 | A1 * | 4/2007 | Arakawa et al. | 365/189.11 |

FOREIGN PATENT DOCUMENTS

| | | |
|---|---|---|
| JP | 9134794 A2 | 5/1997 |
| WO | WO-2008/045411 A2 | 4/2008 |
| WO | WO-2008/045411 A3 | 4/2008 |

OTHER PUBLICATIONS

"Application Serial No. PCT/US2007/21534, Internation Search Report and Written Opinion Mailed Sep. 12, 2008", 10 pages.

* cited by examiner

*Primary Examiner*—VanThu Nguyen
(74) *Attorney, Agent, or Firm*—Schwegman, Lundberg & Woessner P.A.

(57) ABSTRACT

An apparatus and method for improving the performance of an electronic device is disclosed. An idle voltage state is introduced by an adaptive voltage generator when providing or removing a high voltage signal from a line or a node in a circuit. The idle state reduces the undesirable effects of switching disturbances caused by sudden voltage changes in a line or node.

19 Claims, 8 Drawing Sheets

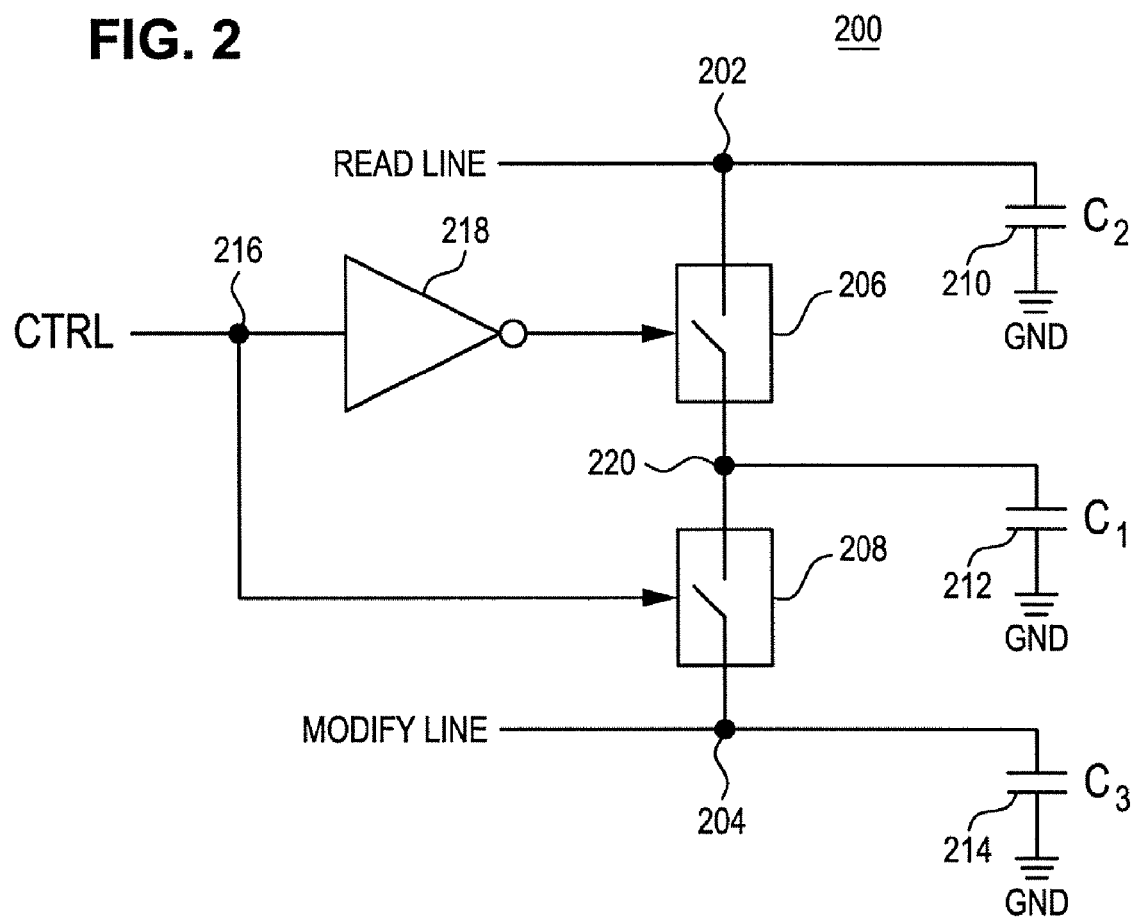

FIG. 5A
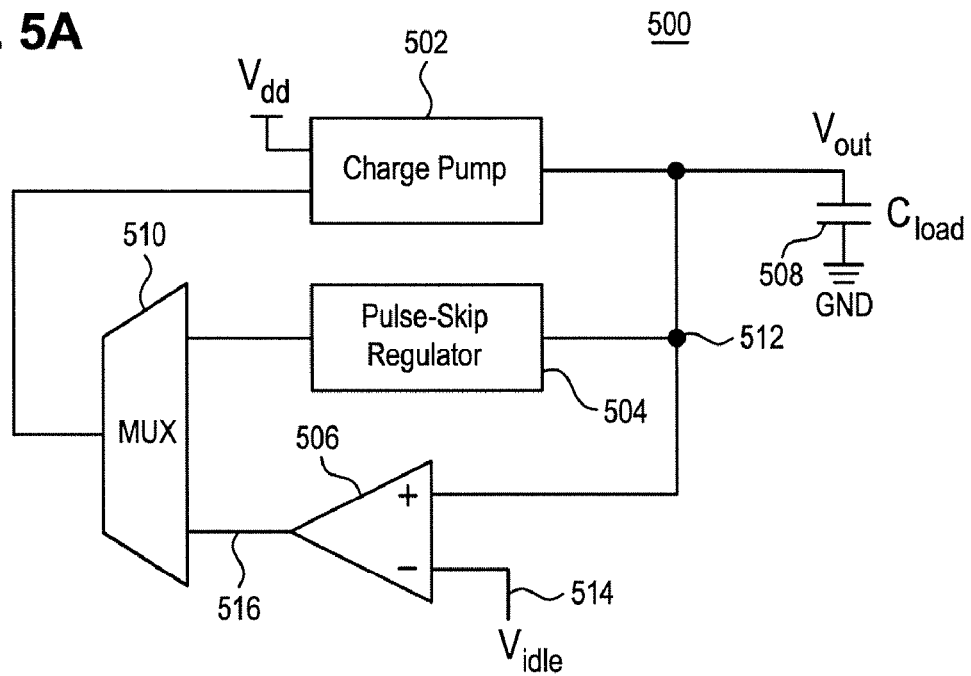
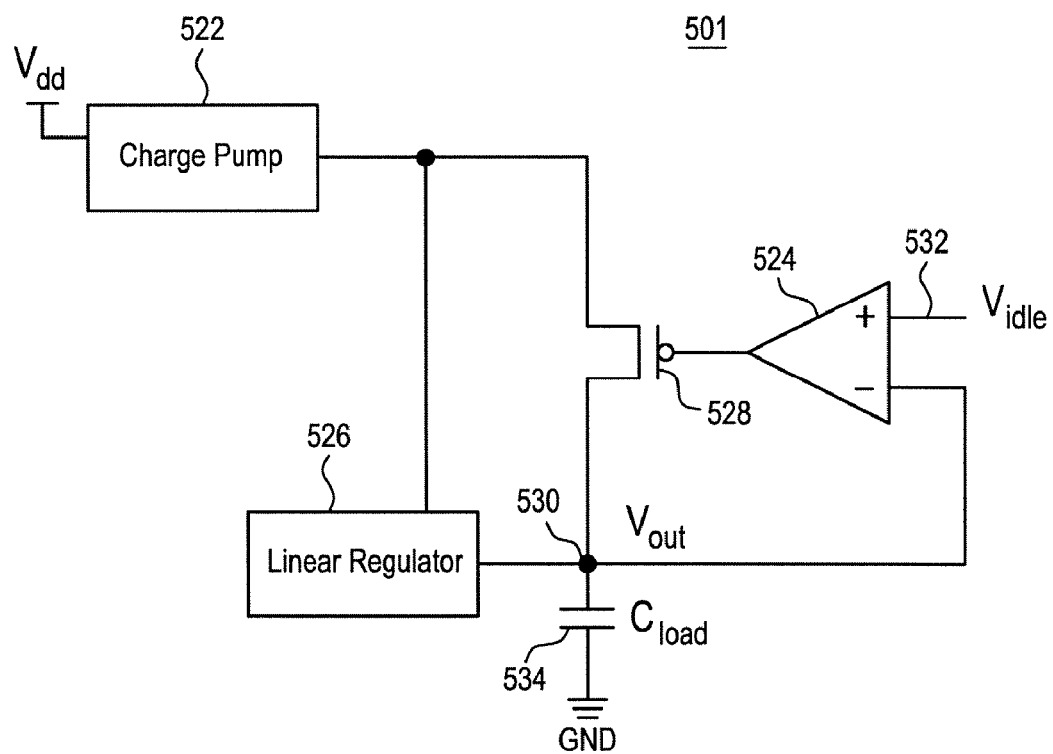
FIG. 5B

ADAPTIVE REGULATOR FOR IDLE STATE IN A CHARGE PUMP CIRCUIT OF A MEMORY DEVICE

FIELD OF INVENTION

The present invention relates to an apparatus and method for generating adaptive idle voltage signals in electronic devices. The electronic device may be a memory device, an automotive component, a mobile phone, a pager, or any electronic circuit that requires the generation of voltage signals, such as by a charge pump, higher than supply voltage levels.

BACKGROUND

A need exists for voltages higher than supply voltage levels in electronic devices. For instance, in order to modify non-volatile memory, such as flash memory, a high voltage level signal is needed for providing Fowler-Nordheim (FN) tunneling. High voltage levels may also be used for reading information stored in a memory cell or memory matrix in circuits otherwise operating at lower power supply voltage levels.

In electronic devices, high voltage signals are typically provided by charge pumps. Charge pumps are switched capacitor circuits which can provide a voltage level to a capacitive load up to $(N+1)*V_{dd}$, where N can be any number of stages in the charge pump and $V_{dd}$ is the supply voltage. The supply voltage $V_{dd}$ is typically 1.8 to 5.5 volts, but can be any other voltage level.

Charge pumps may be controlled by a plurality of clock signals or regulator circuits which control the desired charge pump output voltage level. Methods for regulating a charge pump include pulse-skip regulation and serial or linear regulation. In pulse-skip regulation, charge pump clock signals are enabled when the charge pump output voltage is lower than a desired value and disabled when the charge pump output voltage exceeds the desired value. In linear regulation, the charge pump output voltage is regulated by a closed-loop error amplifier and a pass device, such as a transistor. Linear regulation may provide a continuous adjustment of the charge pump output voltage, rather than the incremental and periodic adjustments provided by pulse-skip regulation.

FIG. 1A illustrates an example of a conventional high voltage level generator circuit 100 with pulse-skip regulation. Supply voltage $V_{dd}$ is coupled to charge pump 102 which provides a high voltage level signal to load capacitance $C_{load}$ 104. Operational amplifier (OP-AMP) 114 provides regulation by comparing the voltage divider level $V_1$ at node 110 to voltage level $V_{BGAP}$ at node 112, which may be a predetermined band-gap voltage level. The band-gap reference voltage $V_{BGAP}$ may be dependent on the materials used to fabricate an electronic device. The voltage level $V_1$ is dependent upon the values of variable resistors $R_1$ 106 and $R_2$ 108. If $V_1 > V_{BGAP}$, a signal 116 is generated and an internal clock signal (not shown) in charge pump 102 is turned OFF, thereby disabling charge pump 102. If $V_1 < V_{BGAP}$, a signal is generated on node 116 for enabling the internal clock signal to enable charge pump 102 to provide a high voltage level signal to $V_{out}$ and capacitance $C_{load}$ 104.

FIG. 1B illustrates an example of a conventional high voltage level generator circuit 101 with linear regulation. In circuit 101, a p-type metal-oxide semiconductor (PMOS) transistor 124 is coupled between node 122 and output node 126 which drives load capacitance $C_{load}$ 128 with a high voltage level signal. A closed-loop amplifier configuration is provided by amplifier 134, transistor 124, and adjustable resistors $R_1$ 130 and $R_2$ 132. Voltage level $V_{BGAP}$ at node 138 is the band-gap voltage level and $V_1$ at node 136 is the voltage divider level. The high voltage level signal provided to $V_{out}$ node 126 and capacitance $C_{out}$ 128 is regulated using linear adjustment provided by the closed-loop configuration. The charge pump 120 provides the necessary supply voltage at node 122 for PMOS transistor 124.

In circuits 100 and 101, the high voltage level $V_{out}$ provided by the charge pumps 102 and 120 is given by Equation(1) as follows:

$$V_{out} = R_{eq} \times V_{BGAP} \qquad \text{Equation(1)}$$

$R_{eq}$ is given by Equation(2) as follows:

$$R_{eq} = \frac{R_1 + R_2}{R_2}. \qquad \text{Equation (2)}$$

Therefore, the high voltage output $V_{out}$ may be adjusted by changing the values of the variable resistors in circuits 100 and 101. The variable resistors may be configurable by using selection transistors which can enable or disable a resistor in series in a circuit, as desired, and provide real time selection of output voltages.

Problems may arise when providing the high voltage signal $V_{out}$ to circuit elements across an electronic device. For example, in memory devices high voltage signals may be used on word-lines, bit-lines, source lines, a common transistor node, or any other node for programming or erasing information in a plurality of memory cells. The high voltage signals are supplied to these lines or nodes by controlled switches. Undesirable switching disturbances on supply lines in a memory device may be caused when a read operation takes place in at least one memory cell while a write or erase operation takes place in at least one other memory cell. Therefore, a need exists for improving electronic device operation by compensating for undesirable voltage supply line effects or disturbances.

SUMMARY

An apparatus and method for improving the performance of an electronic device is disclosed. An idle voltage state is introduced by an adaptive voltage generator when providing or removing a high voltage signal from a line or a node in a circuit. The idle state reduces the undesirable effects of switching disturbances caused by sudden voltage changes in a line or node.

BRIEF DESCRIPTION OF THE DRAWINGS

A more detailed understanding of the invention may be had from the following description, given by way of example and to be understood in conjunction with the accompanying drawings wherein:

FIG. 2 is an illustration of a device for providing a high voltage signal to a memory device in accordance with an embodiment of the present invention;

FIG. 5A is an illustration of an adaptive voltage generator for providing an idle state voltage with a pulse-skip charge pump regulator in accordance with another embodiment of the present invention;

FIG. 5B is an illustration of an adaptive voltage generator for providing an idle state voltage with a linear charge pump regulator in accordance with another embodiment of the present invention;

DETAILED DESCRIPTION OF THE PREFERRED EMBODIMENTS

Figure 1A:
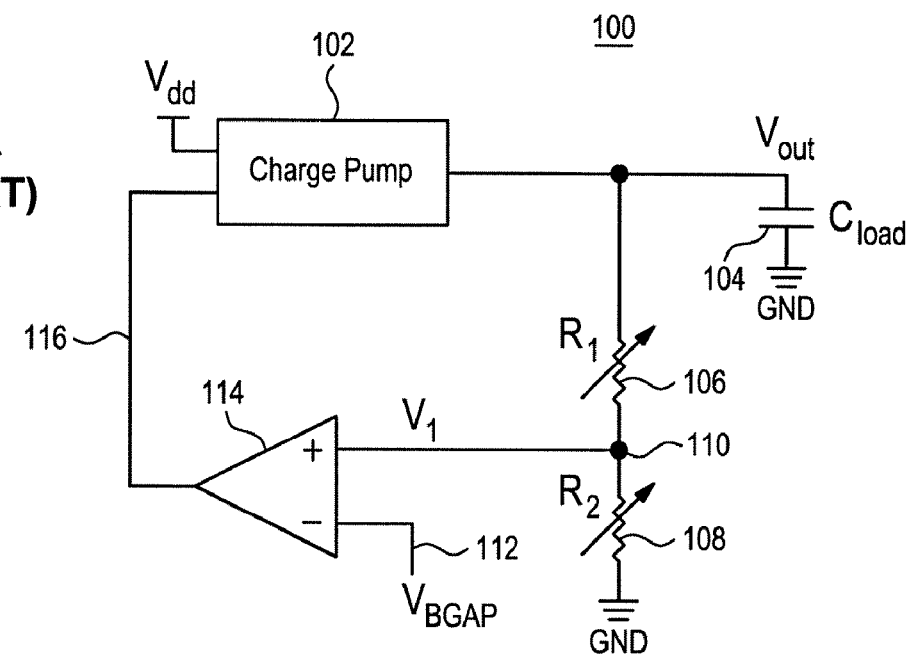
FIG. 1A is an example of a conventional high voltage level generator circuit with pulse-skip regulation.

The present invention will be described with reference to the drawing figures wherein like numerals represent like elements throughout. For purposes of describing the present invention, the phrase low, medium, or high voltage levels are used. It will be appreciated that the words "low", "medium", and "high" are relative terms and not necessarily a fixed voltage. Accordingly, the phrase low, medium, or high voltage level may be any voltage and may vary, for example, based on the processing technology and/or the material in which an electronic device is implemented. The word "level" may represent a fixed voltage or a voltage range, as desired. Moreover, predetermined voltage levels in the description forthcoming can be any voltage level and may be dependent on the design, structure, and materials used to configure a circuit element.

A node, a voltage at a node, or a current at a node may be used interchangeably and a load capacitance may be a parasitic capacitance in the description forthcoming. A line may be a bus line, a node, an interconnect, a connection, or an electric coupling, as desired. In addition, a closed switch may be similar to digital switch being enabled while an open switch may be similar to a digital switch being disabled.

The present invention may be used in any electronic device, such as a memory device or module. Examples of memory devices include parallel or serial Electrically Erasable Programmable Read-Only Memories (EEPROMs), Flash memories, serial Flash memories, and stacked Flash and Random Access Memory (RAM) modules.

FIG. 2 is an illustration of a device 200 for providing a high voltage signal to a memory device. Purely as an example, device 200 may be implemented in a memory device for providing read-while-write (RWW) capability. RWW provides the ability to read information from at least one memory cell or element while writing information in at least one other memory cell coupled to node 220. READ LINE node 202 may be a global read voltage line which provides the ability to selectively read or receive information stored in at least one memory cell. MODIFY LINE node 204 may be a global write or erase voltage line which provides the ability to selectively communicate information to at least one memory cell and change the state of a memory cell which represents binary values 0 or 1, as desired.

Figure 1B:
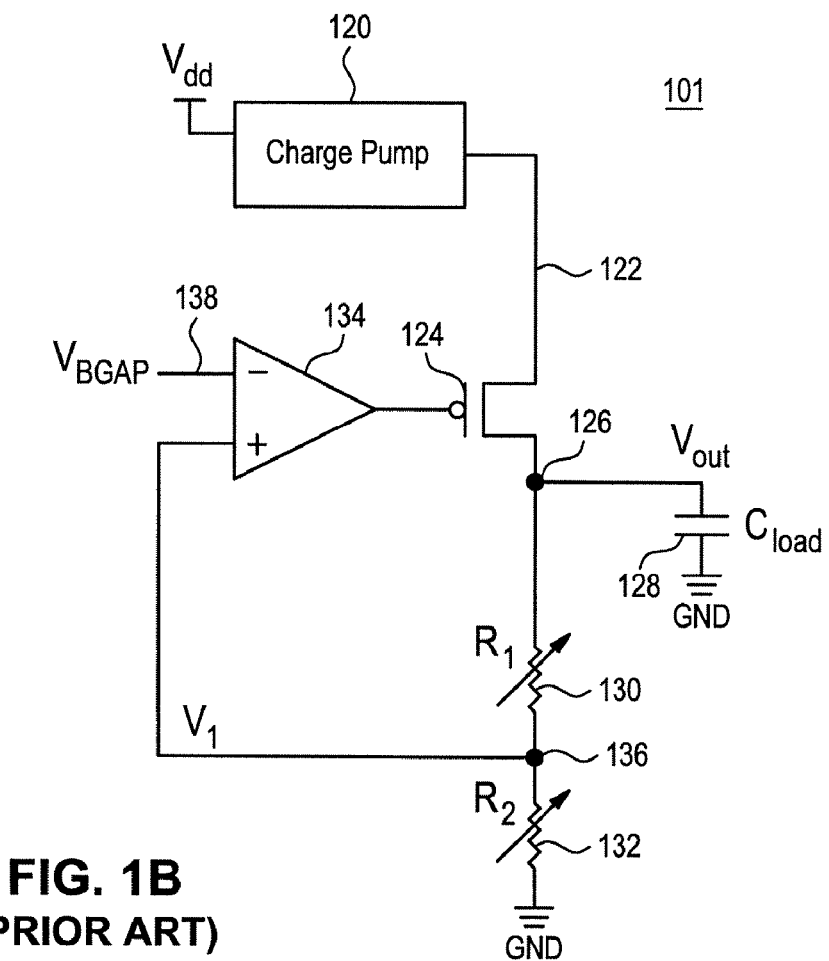
FIG. 1B is an example of a conventional high voltage level generator circuit with linear regulation.

A memory cell, part of a memory cell, or a plurality of memory cells may be coupled to any one of nodes 202, 204, or 220. A low or medium voltage signal on READ LINE node 202 or a high voltage signal applied to MODIFY LINE node 204 may be undesirably disturbed by charge sharing between capacitances $C_1$ 212, $C_2$ 210, and $C_3$ 214 when switching between a read or modify operation in at least one memory element. The high voltage signal applied to node 204 may be provided by a high voltage generator, such as circuits 100 and 101, (shown in FIGS. 1A and 1B, respectively).

Switching between a read or modify operation is provided by switches 206 and 208, which may be transistors, that are controlled by CTRL signal on node 216. READ LINE and MODIFY LINE may be bus lines coupled to additional switches for accessing or modifying information in each memory element in a memory device, as desired. Control signal CTRL at node 216 and inverter 218 selectively control switches 206 and 208 such that only one switch is simultaneously opened or closed. Charge sharing is increased when the difference in voltages levels of nodes 202 and 204 are increased, such as when suddenly switching between read and program operations in at least one memory element coupled to node 220.

Purely as an example, charge sharing can cause a positive voltage variation on node 202 when capacitance $C_1$ 212 is discharged to capacitance $C_2$ 210. A positive voltage disturbance, such as a voltage spike, could damage components coupled to node 202 since the components may be designed to operate at lower voltage levels. Similarly, a negative voltage variation can occur on node 202 by charging capacitance $C_1$ 212 by capacitance $C_2$ 210 which can degrade a read operation performed by other components in the memory device during RWW operation. A negative voltage disturbance on node 204 could degrade programming or erasing performance and speed of a memory device.

Supply line voltage disturbances can be reduced and compensated for if substantially equal voltage levels on nodes 202, 204, and 220 are maintained when switching between read or modify operations. The substantially equal voltage levels may be provided by an adaptive voltage generator that maintains the voltage level on node 220 at a predetermined voltage level substantially equal to the READ LINE voltage level, such as 4.5 volts, until switching communication along lines 202, 204, and 220 is completed in at least one memory cell. Once switching is completed, the high voltage level generator may ramp up the voltage level on nodes 204 and 220 to a predetermined high voltage level, such as 15 volts. A similar idle state may be introduced when node 220 is switched from a high voltage level provided by the MODIFY LINE node 204 to a lower voltage level by first discharging capacitances $C_1$ 212 and $C_3$ 214 to a predetermined level prior to switching.

Figure 3:
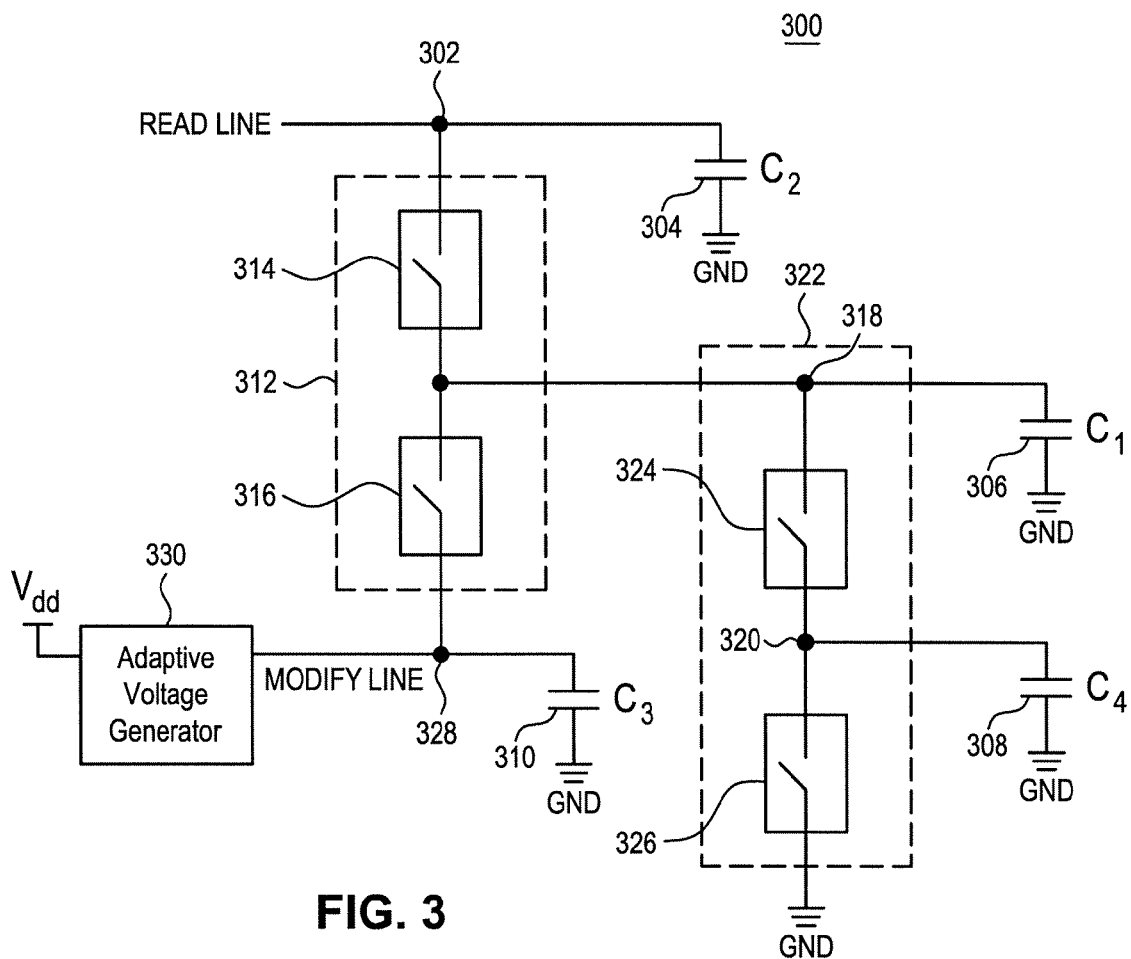
FIG. 3 is an illustration of a device for providing a high voltage signal to a memory device with idle state voltage regulation using two stage switching in accordance with another embodiment of the present invention.

FIG. 3 is an illustration of a device 300 for providing a high voltage level in a memory device with idle state regulation to reduce supply line disturbances using two stage switching. A first stage of switches 312 comprises switches 314 and 316. A second stage of switches 322 comprises switches 324 and 326. Switches 314, 316, 324, and 326 may be transistors or any other devices that perform a switching function. Although only stages 312 and 322 are shown, each memory element in a memory array may have two stages of switches similar to 312 and 322 coupled to any one of READ LINE node 302, MODIFY LINE node 328, and node 320. The control signals, similar to CTRL in FIG. 2, for switches 314, 316, 324, and 326 are not shown for simplicity. Device 300 may provide functionality for reading or programming at least one memory element, part of a memory element, or a plurality of memory elements coupled to any one of nodes 302, 318, or 320.

During a read operation, switches 314 and 324 are closed with READ LINE node 302, capacitances $C_2$ 304, $C_1$ 306, $C_4$ 308 and node 320 having a predetermined voltage level. Accordingly, switches 316 and 326 are open during a read operation. If a modify operation is desired, an adaptive voltage generator 330 is initiated to an idle state and selectively provides the predetermined voltage level to MODIFY LINE node 328 and line capacitance $C_3$ 310. An example of the predetermined voltage level is 4.5 volts, although any voltage level may be used. Switch 316 is then closed and switch 314 is opened with generator 330 providing the predetermined voltage level to node 320. Since the voltage levels at nodes 302 and 328 were substantially equal prior to switches 314 and 316 changing states, no disturbances will occur on the READ and MODIFY lines. The adaptive voltage generator 330 then exits its idle state and raises the MODIFY LINE node 328 to a predetermined high voltage level, such as 15 volts, to modify at least one memory element coupled to node 320.

If a discharge to ground of 320 is needed in any modifying operation with switch 316 and 324 maintained closed (i.e. switch 314 and 326 open), the adaptive voltage generator 330 is lowered to a predetermined lower voltage level. Capacitance $C_4$ 308 and node 320 are then discharged to ground by closing switch 326 and opening switch 324 in order to prevent any voltage disturbances to MODIFY LINE node 328. After discharging is complete, switch 324 is closed and switch 326 is opened providing the predetermined lower level to node 320 by adaptive voltage generator 330. Nodes 318 and 320 are then switched to the READ LINE node 302 by closing switch 314 and opening switch 316 without any supply line disturbances. Table 1 shows a summary of a switching cycle for circuit 300.

TABLE 1

| STATE | Switch 314 | Switch 316 | Switch 324 | Switch 326 |
| --- | --- | --- | --- | --- |
| READ | CLOSED | OPEN | CLOSED | OPEN |
| IDLE/ MODIFY | OPEN | CLOSED | CLOSED | OPEN |
| MODIFY | OPEN | CLOSED | CLOSED | OPEN |
| IDLE/ DISCHARGE | OPEN | CLOSED | OPEN | CLOSED |
| IDLE | OPEN | CLOSED | CLOSED | OPEN |
| READ | CLOSED | OPEN | CLOSED | OPEN |

Figure 4:
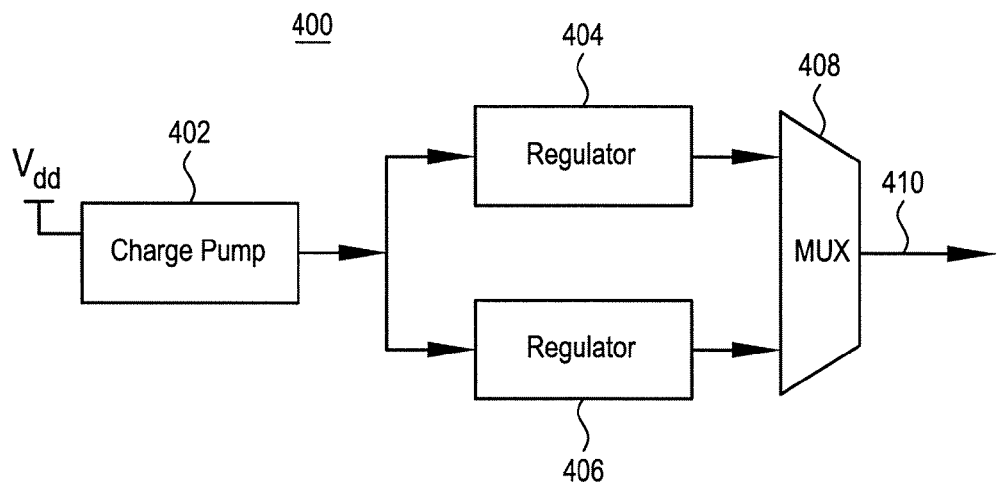
FIG. 4 is an illustration of an adaptive voltage generator for providing an idle state voltage in accordance with another embodiment of the present invention.

FIG. 4 is an illustration of an adaptive voltage generator 400 for providing an idle state voltage to MODIFY LINE 328 and node 320. Charge pump 402 is controlled by regulator 404 and regulator 406. Regulators are electronic circuits that control the desired output level of charge pump 402. Regulator 404 controls charge pump 402 to provide a predetermined high voltage level while regulator 406 controls charge pump 402 to provide a predetermined idle state voltage, which is lower than the high voltage level. The output or target node 410 is switched between the high and idle state voltage levels by multiplexer 408 depending on the desired mode of operation of circuit 300.

In comparison to the embodiment shown in FIG. 4, the following embodiments have the added advantages of occupying reduced device area and providing enhanced configurability. FIG. 5A is an illustration of an adaptive voltage generator 500 for providing an idle state voltage to node 320 with a pulse-skip charge pump regulator. Device 500 comprises charge pump 502, pulse-skip regulator 504, comparator 506, capacitance $C_{load}$ 508, and multiplexer 510. The comparator 506, and any others forthcoming, may be either a voltage sensing comparator or a current sensing comparator or any other circuit element that performs a comparison function, as desired.

Multiplexer 510 switches the charge pump 502 from high voltage mode to a lower idle mode voltage depending on the desired mode of operation of circuit 300. During modify mode, pulse-skip regulator 504 controls charge pump 502 to provide a high voltage level to output or target node 512. During idle state operation, comparator 506 adjusts node 512 accordingly during clock pulses with control signal 516 by raising or lowering the voltage level of $V_{out}$ at node 512 to substantially equal reference voltage level $V_{idle}$ at node 514.

FIG. 5B is an illustration of an adaptive voltage generator 501 for providing an idle state voltage to node 320 with a linear charge pump regulator. Device 501 comprises charge pump 522, comparator 524, linear regulator 526, p-type metal-oxide semiconductor (PMOS) transistor 528, and capacitance $C_{load}$ 534. Comparator 524 compares the voltage level $V_{out}$ at target node 530 to reference voltage level $V_{idle}$ at node 532. During idle state operation, comparator 524 and PMOS transistor adjust node 530 accordingly by raising or lowering the voltage level of $V_{out}$ to substantially equal reference voltage level $V_{idle}$. During modify mode, linear regulator 526 controls charge pump 522 to provide a high voltage level to output node 530.

Figure 6A:
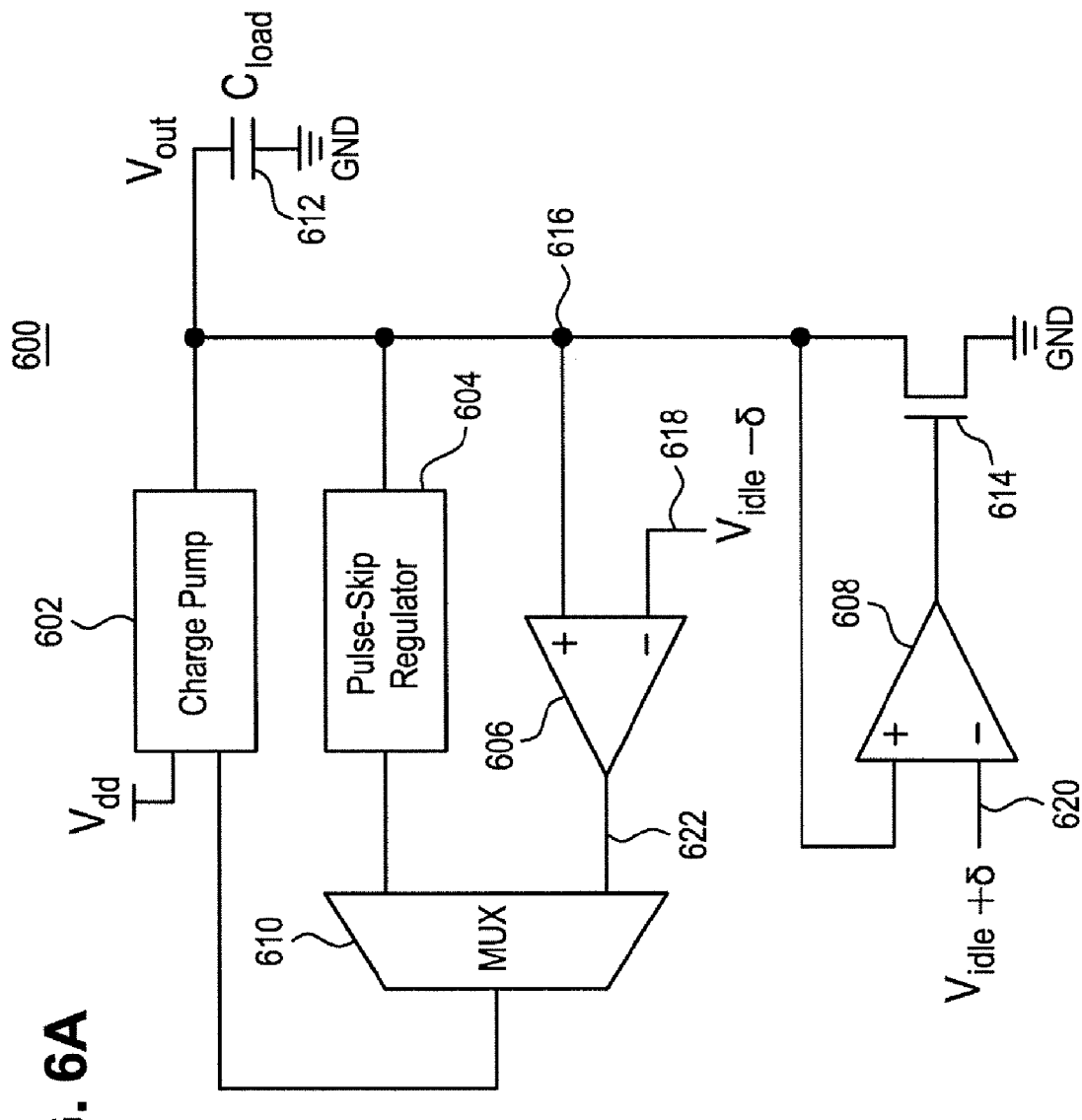
FIG. 6A is an illustration of an adaptive voltage generator for providing an idle state voltage with pulse-skip regulation and disturbance sensitivity in accordance with another embodiment of the present invention.

FIG. 6A is an illustration of an adaptive voltage generator 600 for providing an idle state voltage to node 320 with pulse-skip regulation and disturbance sensitivity. The disturbance sensitivity may be a predetermined sensitivity voltage range of the READ and MODIFY supply lines, as desired. Device 600 comprises charge pump 602, pulse-skip regulator 604, comparator 606, comparator 608, multiplexer 610, and load capacitance $C_{load}$ 612. Multiplexer 610 switches the charge pump 602 from high voltage mode to idle voltage mode depending on the desired mode of operation of circuit 300. During modify mode, pulse-skip regulator 604 controls charge pump 602 to provide a high voltage level to output or target node 616.

During idle mode operation, comparator 606 compares the output voltage $V_{out}$ at node 616 to a reference voltage level $V_{idle}-\delta$ at node 618, where delta $-\delta$ may be any desired decremental sensitivity value. The value delta $\delta$ may also be the maximum allowed supply line voltage disturbance in circuit 300. If $V_{out} < V_{idle}-\delta$, comparator 606 generates a signal 622 to control charge pump 602 to raise the level of node 616. Also during idle mode operation, comparator 608 compares the output voltage $V_{out}$ at node 616 to a reference voltage level $V_{idle}+\delta$ at node 620, where delta $+\delta$ may be any desired incremental sensitivity value. If $V_{out} > V_{idle}+\delta$, comparator 608 activates n-type metal-oxide semiconductor (NMOS) transistor 614 to pull down the voltage level of node 616 by coupling it to ground.

Figure 6B:
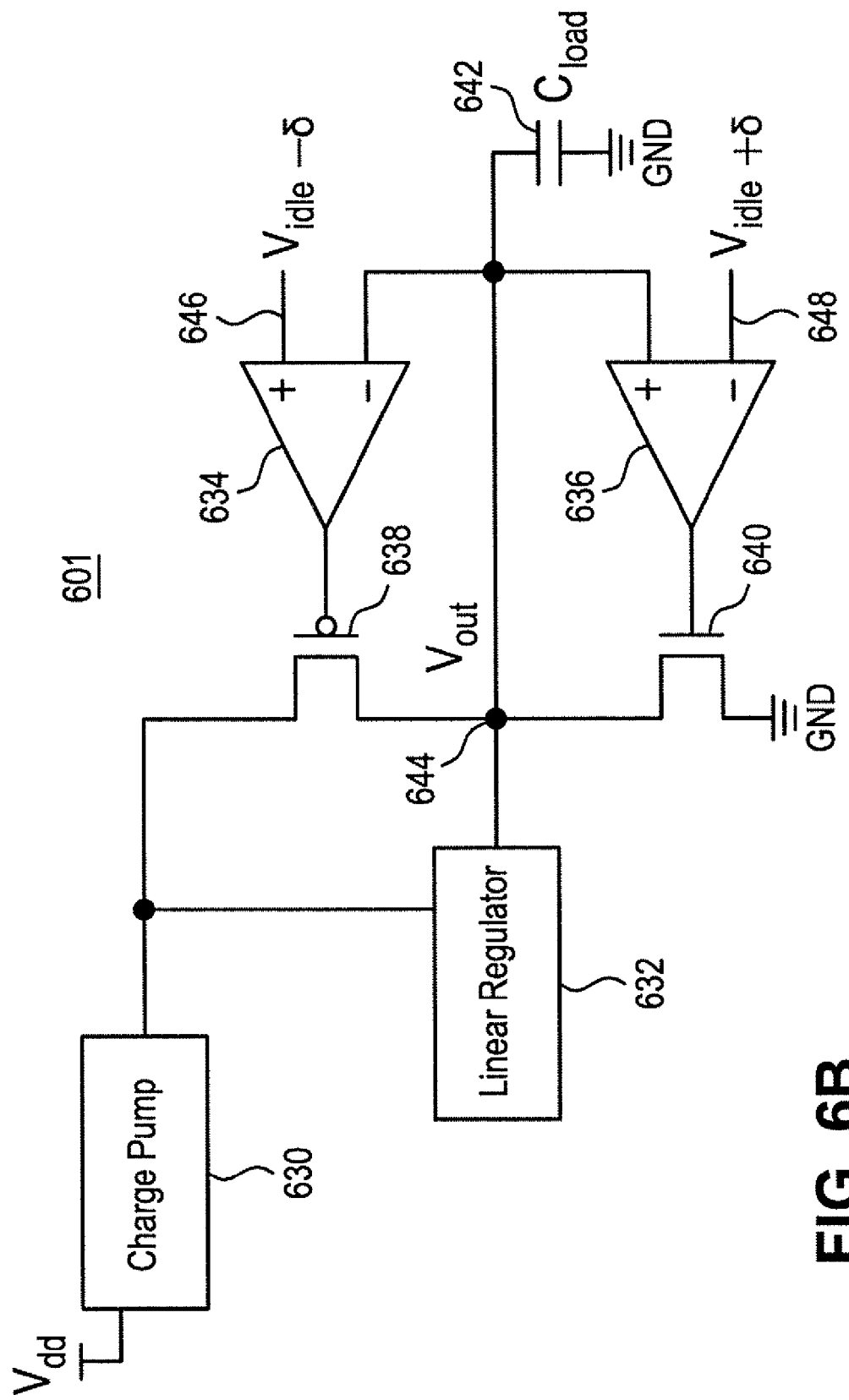
FIG. 6B is an illustration of an adaptive voltage generator for providing an idle state voltage with linear regulation and disturbance sensitivity in accordance with another embodiment of the present invention.

FIG. 6B is an illustration of an adaptive voltage generator 601 for providing an idle state voltage to node 320 with linear regulation and disturbance sensitivity. Device 601 comprises charge pump 630, linear regulator 632, comparator 634, comparator 636, PMOS transistor 638, NMOS transistor 640, and load capacitance $C_{load}$ 642.

During idle mode operation, comparator 634 compares the output voltage $V_{out}$ at node 644 to a reference voltage level $V_{idle}-\delta$ at node 646, where delta $-\delta$ may be any desired decremental sensitivity value. If $V_{out}<V_{idle}-\delta$, comparator 634 activates charge pump 630 to raise the level of node 644 by controlling PMOS transistor 638. Also during idle mode operation, comparator 648 compares the output voltage $V_{out}$ at node 644 to a reference voltage level $V_{idle}+\delta$ at node 648, where delta $+\delta$ may be any desired incremental sensitivity value. If $V_{out}>V_{idle}+\delta$, comparator 636 activates NMOS transistor 640 to pull down the voltage level of node 644 by coupling to ground. During modify mode, linear regulator 632 controls charge pump 630 to provide a high voltage level to output or target node 644.

Figure 7:
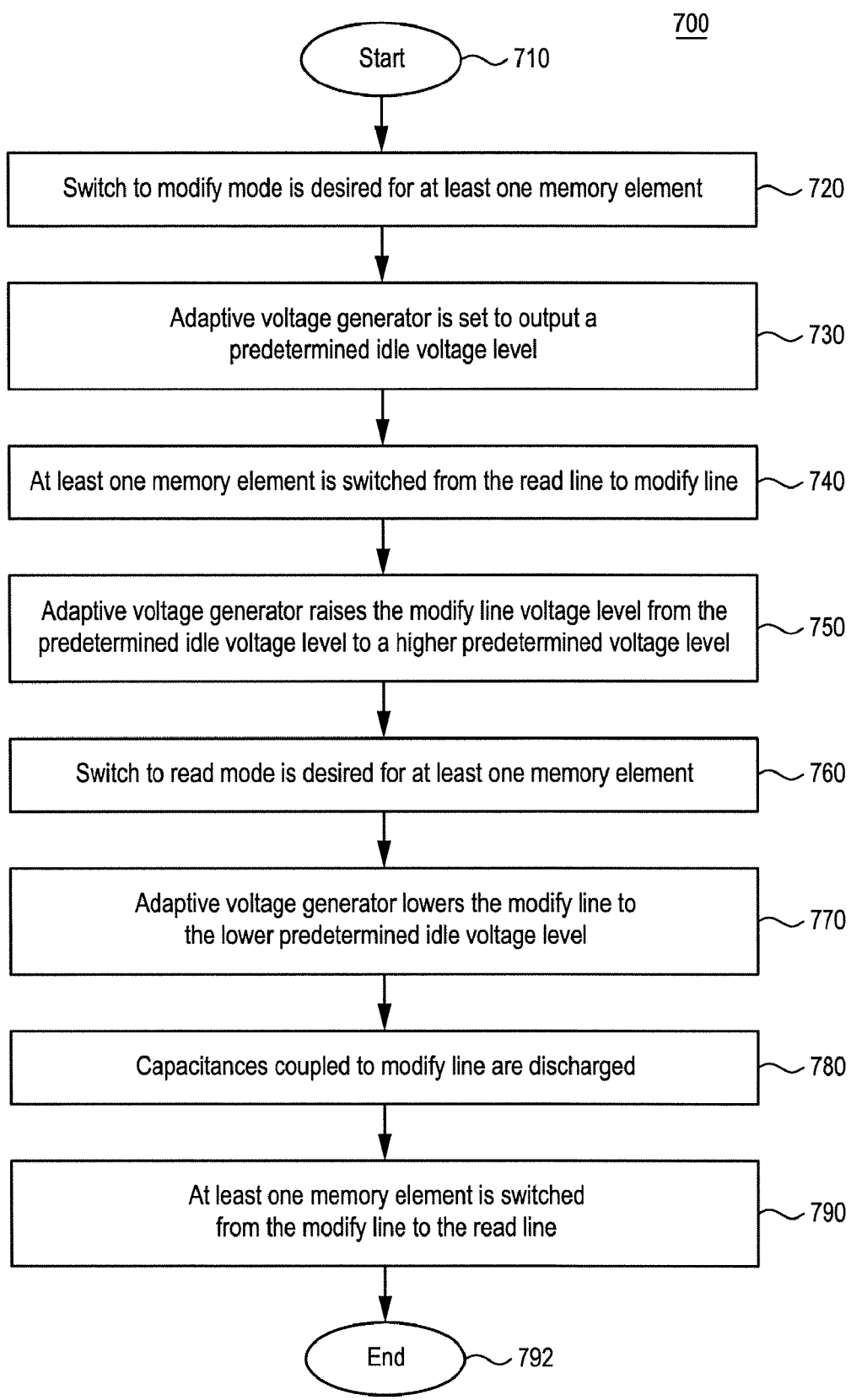
FIG. 7 is a flow diagram of a process for providing an idle state voltage to a memory device in accordance with another embodiment of the present invention.

FIG. 7 is a flow diagram of a process 700 for providing an idle state voltage to a memory device comprising steps 710, 720, . . . 792. Process 700 illustrates steps for switching from a read to modify mode and then back to a read mode in at least one memory cell. However, it should be appreciated to one skilled in the art that process 700 can begin at step 760 if at least one memory cell is already in modify mode and switch to read mode is desired. In process 700, a switch to modify mode operation is desired for at least one memory element in a memory device (step 720). An adaptive voltage generator is set to output a predetermined idle voltage level to a target node (step 730). At least one memory element in the memory device is then switched from a read line to a modify line (step 740). The adaptive voltage generator then raises the target node voltage level from the predetermined idle voltage level to a higher predetermined voltage level (step 750).

Still referring to FIG. 7, a switch to read mode may then be desired for at least one memory element, which may be after a certain time period in modify mode (step 760). The adaptive voltage generator first lowers its output and the target node to the lower predetermined idle voltage level (step 770). Any capacitances coupled to the modify line, if any, are discharged (step 780). At least one memory element is then switched from the modify line to the read line (step 790). The idle state described in 700 provides better flexibility and robust RWW operation since the read operation on the read line in at least one memory element is not disturbed by the simultaneous write or erase operation on the modify line by at least one other memory element.

Figure 8:
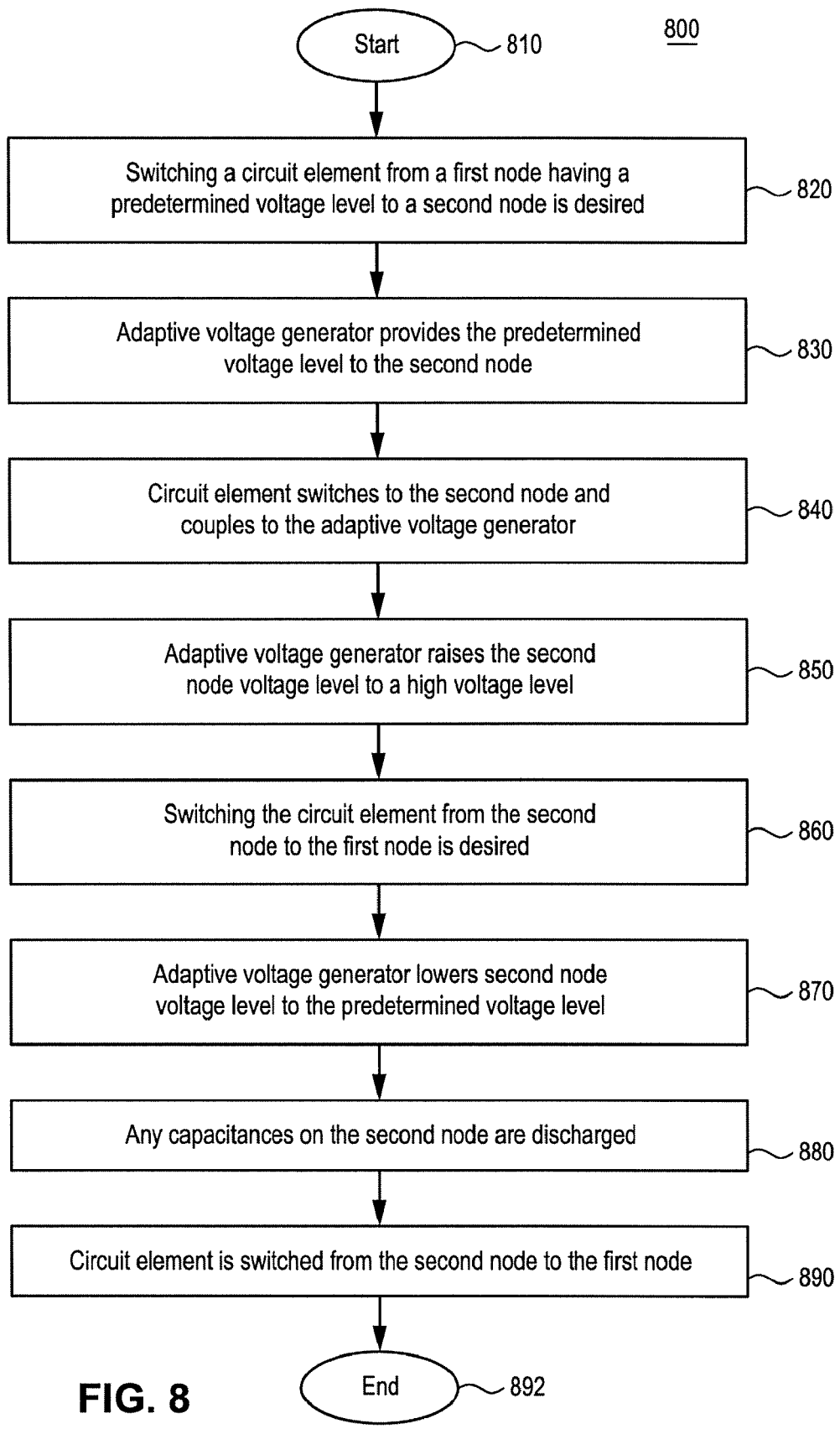
FIG. 8 is a flow diagram of a process for providing an idle state voltage to an electronic device in accordance with another embodiment of the present invention.

FIG. 8 is a flow diagram of a process for providing an idle state voltage to any electronic device comprising steps 810, 820, . . . 892. Process 800 illustrates steps for switching from a first node to a second node and back to the first node in an electronic device. However, it should be appreciated to one skilled in the art that process 800 can begin at step 860 with a circuit element switching from a second node to a first node. In process 800, switching a circuit element coupled to a first node having a predetermined voltage level to a second node is desired (step 820). An adaptive voltage generator provides the predetermined voltage level to the second node prior to switching the circuit element from the first node to the second node (step 830). The circuit element may then switch to the second node and couple to the adaptive voltage generator without any voltage disturbances on the first node (step 840). An adaptive voltage generator proceeds by raising the second node voltage level to a high voltage level (step 850).

Still referring to FIG. 8, switching the circuit element from the second node to the first node may be desired (step 860). The adaptive voltage generator lowers the second node voltage level to the predetermined voltage level (step 870). Any capacitances, including parasitic capacitances, on the second node are discharged (step 880). The circuit element may then be switched from the second node to the first node without any voltage disturbances on the second node (step 890).

Although the features and elements of the present invention are described in the preferred embodiments in particular combinations, each feature or element can be used alone without the other features and elements of the preferred embodiments or in various combinations with or without other features and elements of the present invention. The method for switching nodes provided in the present invention may be implemented in a computer program tangibly embodied in a computer-readable storage medium for execution by a processor or a general purpose computer for use with or by any non-volatile memory device. Suitable processors include, by way of example, both general and special purpose processors.

Typically, a processor will receive instructions and data from a read only memory (ROM), a RAM, and/or a storage device. Storage devices suitable for embodying computer program instructions and data include all forms of non-volatile memory, including by way of example semiconductor memory devices, magnetic media such as internal hard disks and removable disks, magneto-optical media, and optical media such as CD-ROM disks and digital versatile disks (DVDs). Types of hardware components or processors which may be used by or in conjunction with the present invention include Application Specific Integrated Circuits (ASICs), Field Programmable Gate Arrays (FPGAs), microprocessors, or any integrated circuit.

What is claimed is:

1. An apparatus comprising:
   at least one memory element coupled to a modify node, a first node, and a read node, the read node to receive a voltage having a predetermined voltage level and to selectively provide information stored in the at least one memory element, the first node having a first capacitance and a first capacitance voltage level; and
   an adaptive voltage generator coupled to the modify node to selectively modify information in the at least one memory element coupled to the modify node, wherein the adaptive voltage generator is configured to maintain the first node and the modify node at the predetermined voltage level when switching between a modify operation and a read operation in the at least one memory element.

2. The apparatus of claim 1 wherein the adaptive voltage generator is further configured to raise the first capacitance voltage level to a high voltage level greater than the predetermined voltage level after switching from the read operation to the modify operation in the at least one memory element.

3. The apparatus of claim 1 wherein the first capacitance is to coupled to a ground node to discharge the first capacitance voltage level when switching from the modify operation to the read operation in the at least one memory element.

4. The apparatus of claim 3 wherein the adaptive voltage generator is configured to maintain the first capacitance voltage level at the predetermined voltage level lower than a high voltage level after discharging of the first capacitance voltage level.

5. The apparatus of claim 1 wherein the predetermined voltage level is a read voltage level used during a read operation in the at least one memory element.

6. An apparatus comprising:
   at least one memory element coupled to a modify node, a first node, and a read node, the read node to selectively provide information stored in the at least one memory element, the first node having a first capacitance and a first capacitance voltage level;

an adaptive voltage generator coupled to the modify node to selectively modify information in the at least one memory element coupled to the modify node, wherein the adaptive voltage generator is configured to maintain the first node at a predetermined voltage level when switching between a modify operation and a read operation in the at least one memory element;

a first switch coupled between the read node and the first node;

a second switch coupled between the first node and the modify node;

a third switch coupled between the first node and a second node;

a fourth switch coupled between the second node and a ground node; and a second capacitance coupled between the second node and the ground node.

7. The apparatus of claim 6 wherein the adaptive voltage generator is configured to switch the first switch and the second switch to provide the predetermined voltage level to the second capacitance when switching from the read operation to the modify operation in the at least one memory element.

8. The apparatus of claim 7 wherein the adaptive voltage generator is configured to raise a second capacitance voltage level of the second capacitance to a high voltage level after switching from the read operation to the modify operation in the at least one memory element.

9. The apparatus of claim 6 wherein the fourth switch and the third switch are to couple the second capacitance to the ground node to discharge the second capacitance when switching from the modify operation to the read operation in the at least one memory element.

10. The apparatus of claim 9 wherein the adaptive voltage generator is configured to maintain the second capacitance voltage level at the predetermined voltage level lower than the high voltage level after discharging of the second capacitance.

11. The apparatus of claim 10 wherein the first node is coupled to the read node when the first switch switches.

12. An apparatus comprising:

a read node to receive a first voltage;

a modify node;

a switching stage coupled between the read node and the modify node, the switching stage including a first node; and an adaptive voltage generator configured to apply a second voltage having a first value corresponding to a value of the first voltage to the modify node before the switching stage couples the first node to the modify node.

13. The apparatus of claim 12 wherein the adaptive voltage generator is further configured to raise second voltage to a second value higher than the first value after the switching stage couples the first node to the modify node.

14. The apparatus of claim 13 further comprising a switch configured to couple the first node to a second node when the first node is coupled to the modify node.

15. The apparatus of claim 14 wherein the adaptive voltage generator is further configured to reduce second voltage to a third value lower than the second value before the second node is discharged.

16. The apparatus of claim 12 further comprising at least one memory element coupled to at least one of the read node, the first node, and the modify node.

17. The apparatus of claim 12 wherein the switching stage includes a first switch coupled between the read node and the first node, and a second switch coupled between the first node and the modify node.

18. The apparatus of claim 17 wherein the switching stage is configured to close only one of the first and second switches at a time.

19. The apparatus of claim 17 further comprising a node to receive a control signal to control the first switch with the control signal and control the second switch with an inversion of the control signal.

* * * * *